(12) United States Patent
Nakamura et al.

(10) Patent No.: US 7,009,816 B2
(45) Date of Patent: Mar. 7, 2006

(54) HEAD SUPPORT MECHANISM AND MAGNETIC DISK DEVICE

(75) Inventors: Shigeo Nakamura, Odawara (JP); Naoki Maeda, Hiratsuka (JP); Shinobu Hagiya, Odawara (JP); Haruhide Takahashi, Odawara (JP); Kousaku Wakatsuki, Odawara (JP)

(73) Assignee: Hitachi Global Storage Technologies Japan, Ltd., Odawara (JP)

( * ) Notice: Subject to any disclaimer, the term of this patent is extended or adjusted under 35 U.S.C. 154(b) by 32 days.

(21) Appl. No.: 10/733,105

(22) Filed: Dec. 10, 2003

(65) Prior Publication Data

US 2004/0228038 A1  Nov. 18, 2004

(30) Foreign Application Priority Data

May 12, 2003  (JP)  ............................. 2003-132736

(51) Int. Cl.
*G11B 5/55*  (2006.01)

(52) U.S. Cl. .................................................. 360/264.2

(58) Field of Classification Search .. 360/264.2–264.5, 360/294.3, 244.1
See application file for complete search history.

(56) References Cited

U.S. PATENT DOCUMENTS

| | | | | |
|---|---|---|---|---|
| 5,012,368 A * | 4/1991 | Bosier et al. | ............ | 360/264.2 |
| 5,844,753 A * | 12/1998 | Inaba | ...................... | 360/264.1 |
| 5,978,177 A * | 11/1999 | Takasugi | ................. | 360/245.9 |
| 5,991,123 A * | 11/1999 | Casey | ..................... | 360/264.2 |
| 6,212,046 B1 * | 4/2001 | Albrecht et al. | ......... | 360/264.2 |
| 6,222,704 B1 * | 4/2001 | Aoyagi et al. | ........... | 360/244.9 |
| 6,634,086 B1 * | 10/2003 | Korkowski et al. | ...... | 29/603.03 |
| 6,714,383 B1 * | 3/2004 | Kado et al. | .............. | 360/244.1 |
| 6,731,472 B1 * | 5/2004 | Okamoto et al. | ........ | 360/294.3 |

FOREIGN PATENT DOCUMENTS

JP  10-092126 A  4/1998
JP  2002-324823 A  11/2002

* cited by examiner

*Primary Examiner*—Allen Cao
(74) *Attorney, Agent, or Firm*—Townsend and Townsend and Crew LLP

(57) ABSTRACT

To strengthen a flying lead portion of a long-tail flexible printed circuit (FPC) integrally formed with a flexure, stacked support portions of resin layers on both sides of a flying lead 7 of a long-tail FPC 6 are reinforced with metal frames 14. A fold-back portion 9 of the long-tail FPC 6 is folded back at 90 degrees so that flying lead 7 is disposed parallel with a turning shaft 21 of a carriage 20. The flying lead is then joined to a connection pad 26 on a main FPC board 24 using solder 18.

20 Claims, 3 Drawing Sheets

41 SIGNAL PROCESSING CIRCUIT
42 HDC
43 INTERFACE

HEAD SUPPORT MECHANISM AND MAGNETIC DISK DEVICE

CROSS-REFERENCE TO RELATED APPLICATION

This application claims priority from Japanese Application No. 2003-132736, filed May 12, 2003, the entire disclosure of which is incorporated by reference for all purposes.

BACKGROUND OF THE INVENTION

The present invention relates generally to a magnetic disk device, and more particularly to a flying lead portion structure of a long-tail flexible printed circuit (FPC) integrally molded with a flexure of a head support mechanism.

A magnetic disk device writes and reads data to and from a rotating magnetic disk by allowing a head slider supported by a flexure to float over the rotating magnetic disk. With the aim of improving a recording frequency band, the long-tail wiring system is replacing the so-called short-tail wiring system. The long-tail wiring system is a flexure and a thin-film wiring pattern portion including a connection portion to a main FPC board that are integrally formed. The short-tail wiring system is an electric connection established between a signal line from the head slider and a connection terminal of the main FPC board through a relay FPC.

The long-tail wiring system uses a so called flying lead; that is, the thin film wiring pattern of the connection portion to the connection terminal of the main FPC board is exposed. The connection is soldered or ultrasonically bonded to the connection terminal of the main FPC board.

Japanese Patent Laid open No. 2002 324823 (Pages 3 and 7; FIGS. 4 and 16), hereby incorporated by reference, discloses a technique in which the terminal of a long-tail FPC on a side of a magnetic head element is wire bonded to a magnetic head element, while a flying lead on a side opposite to the magnetic head element is soldered to a main FPC pad in a low oxygen concentration atmosphere.

If the flying lead is disposed to run parallel to the turning shaft of a carriage, it gives the flying lead a wide area for a connection portion to a connection terminal on the main FPC board. This, however, presents a problem that a stacked portion composed of a polyimide layer supporting the flying lead and a thin-film wiring pattern becomes thinner, whereby the strength of the stacked portion is reduced.

SUMMARY OF THE INVENTION

The present invention provides a head support mechanism, and a magnetic disk device mounted with a head support mechanism, offering high connection reliability by providing a sufficient strength for a flying lead portion of a long-tail FPC.

A head support mechanism according to an aspect of the present invention comprises a flexure supporting a head slider, a load beam supporting the flexure and giving a load to the head slider, and a mount supporting the load beam. A flying lead and a wiring pattern are provided at one end of the head support mechanism, with the flying lead preferably arranged to be parallel to a rotary shaft of a carriage. One side of each of the resin layer portions covering both sides of the flying lead is supported by a metal frame electrically insulated from the flying lead and the wiring pattern. The frame may be made of stainless steel.

A head support mechanism according to another aspect of the present invention comprises a flexure supporting a head slider, a load beam supporting the flexure, a hinge supporting the load beam and giving a load to the head slider, and a mount supporting the hinge. A flying lead and a wiring pattern are provided at one end of the head support mechanism, with the flying lead preferably arranged to be parallel to a rotary shaft of a carriage. One side of each of the resin layer portions covering both sides of the flying lead is supported by a metal frame electrically insulated from the flying lead and the wiring pattern. The frame may be made of stainless steel.

A magnetic disk device according to another aspect of the present invention comprises a head support mechanism; a carriage rotatably mounted on a pivot and provided with a coil at one end of the carriage and a carriage arm, at the other end, which is mounted with the head support mechanism by way of the mount; a magnetic circuit for applying a magnetic field to the coil; and a magnetic disk mounted on a rotary shaft. The head support mechanism includes a flexure supporting a head slider, a load beam supporting the flexure and giving a load to the head slider, and a mount supporting the load beam. A flying lead and a wiring pattern are provided at one end of the head support mechanism, with the flying lead preferably arranged to be parallel to a rotary shaft of the carriage. One side of each of the resin layer portions covering both sides of the flying lead is supported by a metal frame electrically insulated from the flying lead and the wiring pattern.

A magnetic disk device according to another aspect of the present invention comprises a head support mechanism; a carriage rotatably mounted on a pivot and provided with a coil at one end of the carriage and a carriage arm, at the other end, which is mounted with the head support mechanism by way of the mount; a magnetic circuit for applying a magnetic field to the coil; and a magnetic disk mounted on a rotary shaft. The head support mechanism includes a flexure supporting a head slider, a load beam supporting the flexure, a hinge supporting the load beam and giving a load to the head slider, and a mount supporting the hinge. A flying lead and a wiring pattern are provided at one end of the head support mechanism, with the flying lead preferably arranged to be parallel to a rotary shaft of the carriage. One side of each of the resin layer portions covering both sides of the flying lead is supported by a metal frame electrically insulated from the flying lead and the wiring pattern.

A further understanding of the nature and advantages of the present invention may be realized by reference to the remaining portions of the specification and the drawings.

DESCRIPTION OF SPECIFIC EMBODIMENTS

Figure 1:
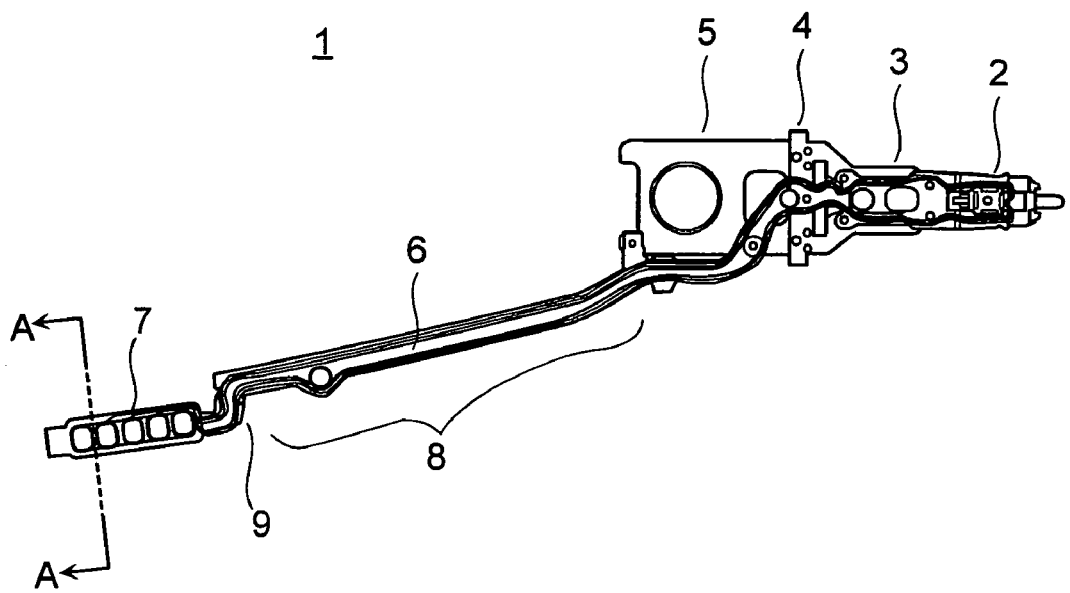
FIG. 1 is a plan view of a lead support mechanism according to an embodiment of the present invention.
Figure 2:
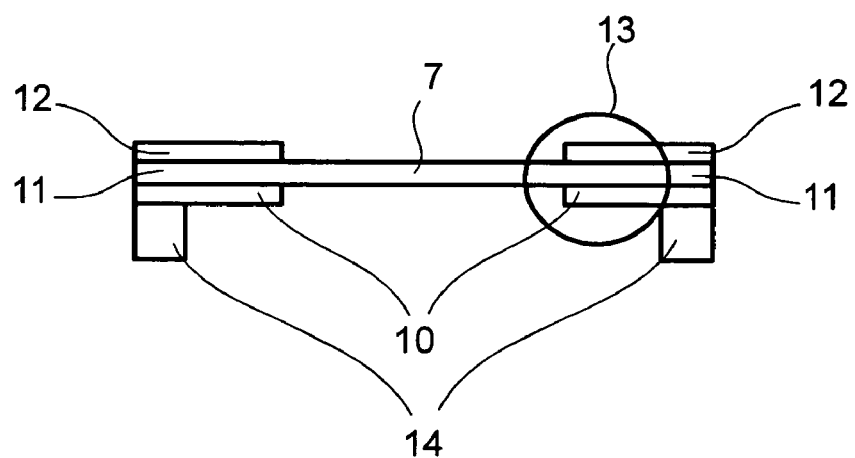
FIG. 2 is a cross-sectional view taken along line A—A of FIG. 1.
Figure 3:
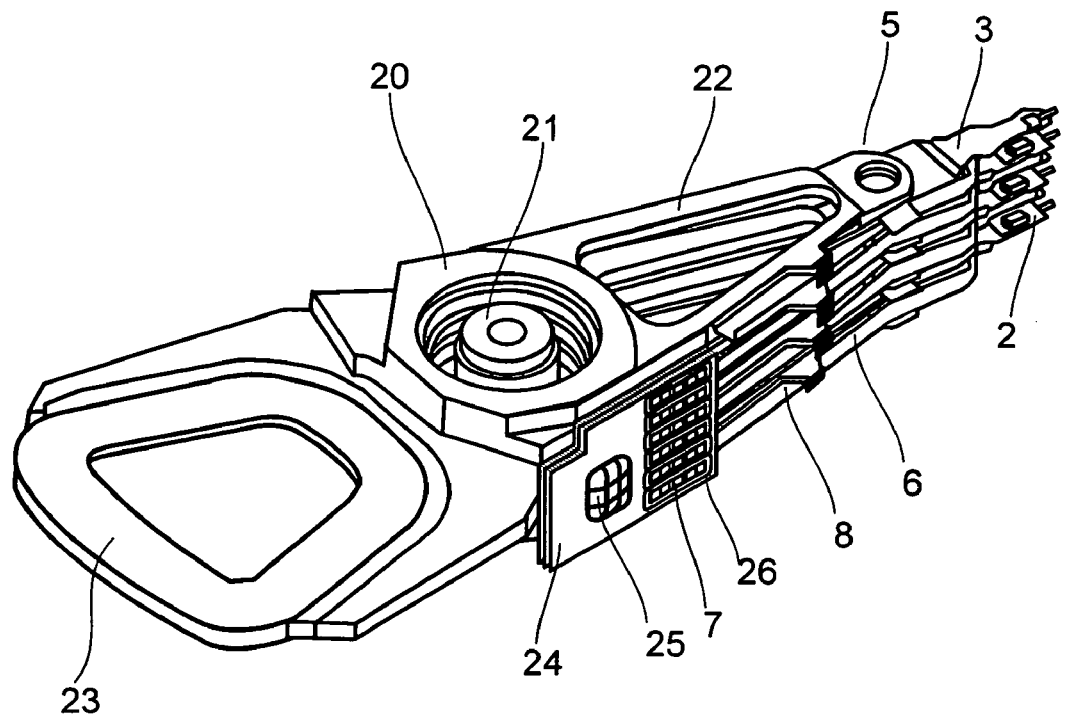
FIG. 3 is a perspective view showing a lead stack assembly mounted with the head support mechanism shown in FIG. 1.
Figure 4:
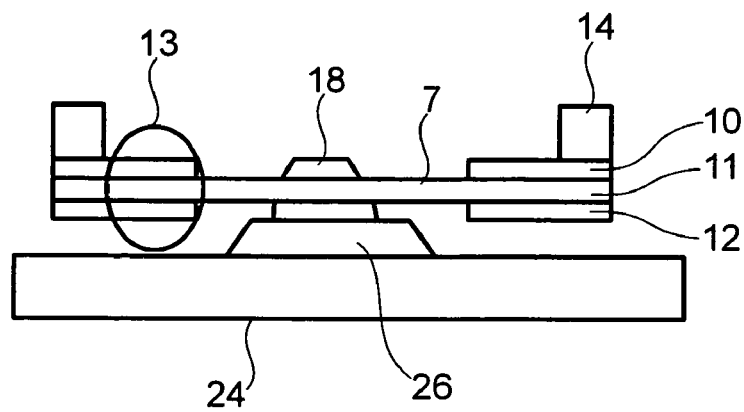
FIG. 4 is a cross-sectional view showing a flying lead connection structure of the head support mechanism according to an embodiment of the present invention.
Figure 5:
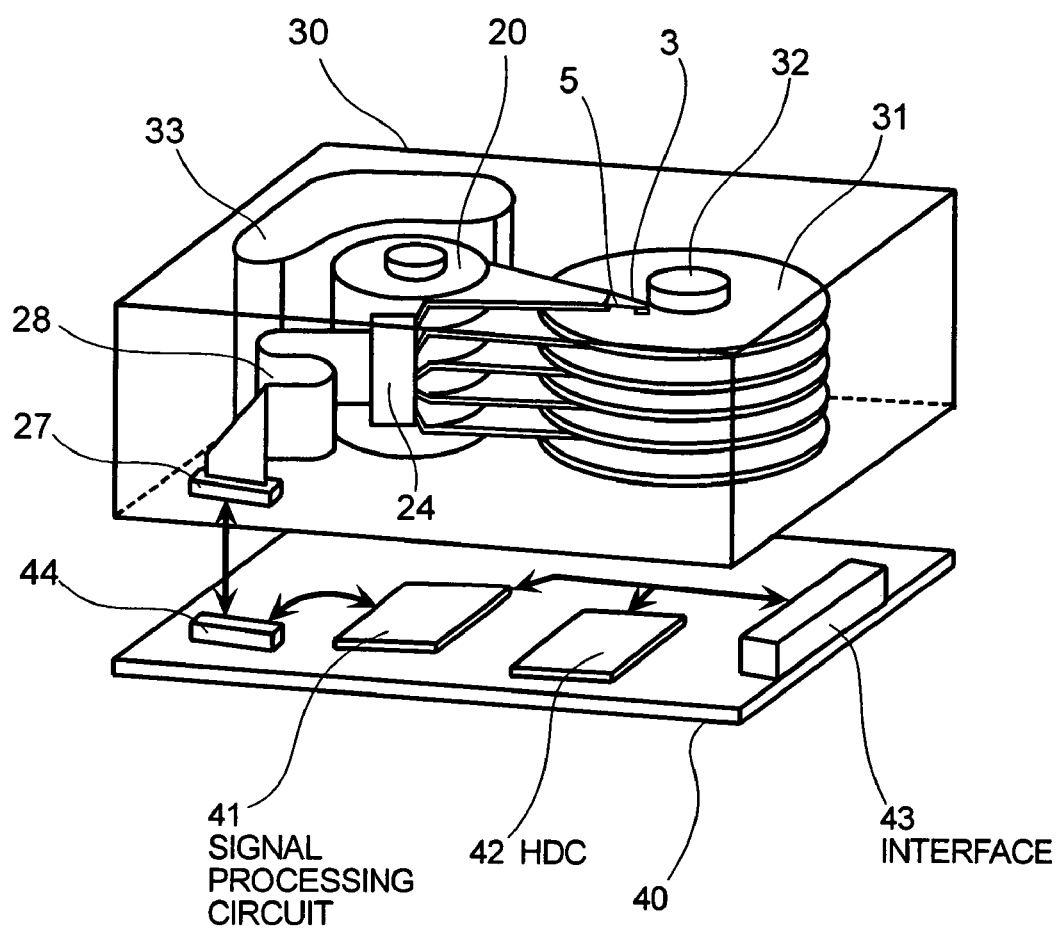
FIG. 5 shows the construction of a magnetic disk device mounted with the head stack assembly shown in FIG. 3.

A preferred embodiment of the present invention is now explained with reference to the accompanying drawings. FIG. 1 is a plan view showing an overall construction of a head support mechanism 1. FIG. 2 is a cross sectional view taken along a line A—A of FIG. 1, showing the construction of a flying lead 7. FIG. 3 is a perspective view showing the construction of a head stack assembly (hereinafter referred to as the "HSA") that represents a plurality of head support mechanisms 1 assembled into a carriage 20. FIG. 4 is a cross sectional view showing a state in which flying lead 7 of head support mechanism 1 is bonded to a connection pad 26 on a main FPC board 24 using solder 18. FIG. 5 shows the construction of a magnetic disk device, in which the HSA is mounted.

Referring to FIG. 1, head support mechanism 1 includes a flexure 2 holding in position a head slider (not shown) for writing and reading data, a load beam 3 mounted with flexure 2, a hinge 4 mounted with load beam 3 and giving a load to the head slider, and a mount 5 mounted with hinge 4. Stainless steel or the like is used as a base material for flexure 2, load beam 3, hinge 4, and mount 5. A long-tail FPC 6 of a stacked structure composed of a base polyimide layer, a wiring pattern, and a cover polyimide layer laminated on the base material is integrally formed with flexure 2. Long-tail FPC 6 is provided with a tail 8 that extends from a rear end (a side opposite to load beam 3) of mount 5 and a connection portion 7 on an end portion thereof. Connection portion 7 forms a flying lead.

Referring to FIG. 2, stacked portions 13 each composed of a wiring pattern 11 sandwiched between a base polyimide resin layer 10 and a cover polyimide resin layer 12, respectively, supports both sides of flying lead 7. Metal frames 14, each of which is electrically insulated from flying lead 7 and wiring pattern 11 by base polyimide resin layer 10, support the associated external sides of stacked portions 13 supporting the associated sides of flying lead 7. Metal frame 14, formed of a stainless steel sheet or the like, serves as a framework for reinforcing an outer peripheral portion of flying lead 7. Flying lead 7 is disposed transversely of tail 8 at an angle of about 90 degrees relative to tail 8, extending from the rear of mount 5 of head support mechanism 1.

Referring to FIG. 3, head support mechanism 1 is attached by joining mount 5 to a carriage arm 22 of a carriage 20. Carriage 20 is rotatably mounted on a pivot (a turning shaft) 21. A coil 23 that generates a rotary driving force is mounted on a side opposite to carriage arm 22 of carriage 20. A main FPC board 24 is mounted on a side surface of carriage 20. A write/read IC 25 is attached to main FPC board 24. A connection pad 26 for soldering flying lead 7 thereto is formed on a flexure side of main FPC board 24 (see FIG. 4). A main FPC 28 (see FIG. 5) electrically connected to connection pad 26 extends from a coil side of main FPC board 24.

Tail 8 of long-tail FPC 6 is disposed along carriage arm 22 and hooked onto a tab portion of carriage arm 22. Flying lead 7 is folded back at a fold-back portion 9 substantially at an angle of 90 degrees from the condition depicted in FIG. 1. This allows flying lead 7 to be disposed parallel to turning shaft 21 of the carriage 20 as shown in FIG. 3. Then, as shown in FIGS. 3 and 4, flying lead 7 is placed on connection pad 26 of main FPC board 24 and solder 18 is deposited to cover flying lead 7 to complete a joining process.

In accordance with the embodiment of the present invention, flying lead 7 is disposed substantially parallel with turning shaft 21 of carriage 20. An approach may be possible to widen flying lead 7, in order to enhance the strength of the connection portion with connection pad 26 of main FPC board 24. Even if this approach is taken, it is possible to keep a lamination pitch of the plurality of head support mechanisms 1 of the HSA from widening. This allows a large number of head support mechanisms 1 to be mounted on carriage 20. As described earlier, metal frame 14 supports the exterior of lamination portion 13, supporting each of the two sides of flying lead 7. This provides sufficient strength for lamination portion 13. As a result, the joint between flying lead 7 and connection pad 26 can be strengthened. Furthermore, this arrangement allows the condition of joints made with solder 18 to be checked visually after soldering. This leads to enhanced reliability.

According to the preferred embodiment of the present invention, load beam 3 and hinge 4 come as separate parts. The same effects as those produced from the embodiment described in the foregoing can still be obtained from a suspension structure having a load beam integrated with a head slider to apply loads.

FIG. 5 shows the construction of a magnetic disk device, in which the HSA according to the embodiment described above is mounted. The magnetic disk device includes a head disk assembly (HDA) 30 and a signal processing board 40. HDA 30 includes magnetic disks 31 for recording data thereon, a spindle (rotary shaft) 32 on which magnetic disks 31 are mounted, the HSA provided with a head slider (not shown) for writing and reading data to and from magnetic disks 31, and a voice coil motor (VCM) 33 for turning carriage 20. HDA 30 basically operates as follows: the head slider held by flexure 2 floats above a rotating magnetic disk 31 with a minimal gap maintained therefrom; VCM 33 turns carriage 20 around turning shaft 21; and the head slider is thereby moved radially across magnetic disk 31 to write data thereto and read data therefrom.

Signal processing board 40 includes a signal processing circuit 41, a hard disk controller (HDC) 42, and an interface 43 for providing a connection to an external device. An electrical connection between HDA 30 and signal processing board 40 is established using a connector 27 and a connector 44.

When the HSA perform a high-speed seek operation or overruns during operation of the magnetic disk device; an inertia force acts on tail 8 of the long-tail FPC 6 in a seek direction. This applies a peeling force to the connection portion of flying lead 7. As noted earlier, however, metal frame 14 supports the exterior of resin layer (the lamination portion) 13 supporting each of the two sides of flying lead 7. This ensures a sufficient strength at lamination portion 13 and the connection portion. It is therefore possible to provide a magnetic disk device offering high reliability in connection of the flying lead portion to withstand seek operations and overruns of the HSA.

As described in the foregoing, according to the present invention, the strength of the flying lead portion can be secured. This allows connection reliability of the long-tail FPC to be increased. It is also possible to realize a magnetic disk device offering good mountability of the head support mechanism and outstanding reliability.

While the above is a complete description of specific embodiments of the invention, the above description should not be taken as limiting the scope of the invention as defined by the claims.

What is claimed is:

1. A head support mechanism comprising:
   a flexure supporting a head slider;
   a load beam supporting said flexure and giving a load to said head slider; and
   a mount supporting said load beam;
   wherein a flying lead with plural flying lead members and a wiring pattern with plural wires connected to the flying lead members of the flying lead are provided at one end of the head support mechanism;
   wherein the plural flying lead members of the flying lead are spaced from each other by open spaces in a longitudinal direction of the head support mechanism;
   wherein the wiring pattern is covered with resin layer on both surface sides; and
   wherein one side of each of the resin layer is supported by a metal frame formed in the longitudinal direction of the head support mechanism, electrically insulated from said flying lead and said wiring pattern.

2. The head support mechanism according to claim 1, wherein said metal frame is made of stainless steel.

3. The head support mechanism according to claim 1, wherein a longitudinal direction of said metal frame is different from a longitudinal direction of the flying lead.

4. The head support mechanism according to claim 1, wherein an angle between a longitudinal direction of said metal frame and a longitudinal direction of the flying lead is substantially 90°.

5. The head support mechanism according to claim 1, wherein metal frames are formed on both edge sides of said flying lead.

6. A head support mechanism comprising:
   a flexure supporting a head slider;
   a load beam supporting said flexure;
   a hinge supporting said load beam and giving a load to said head slider; and
   a mount supporting said hinge;
   wherein a flying lead with plural flying lead members and a wiring pattern with plural wires connected to the flying lead members of the flying lead are provided at one end of the head support mechanism;
   wherein the plural flying lead members of the flying lead are spaced from each other by open spaces in a longitudinal direction of the head support mechanism;
   wherein the wiring pattern is covered with resin layer on both surface sides; and
   wherein one side of each of the resin layer is supported by a metal frame formed in the longitudinal direction of the head support mechanism, electrically insulated from said flying lead and said wiring pattern.

7. The head support mechanism according to claim 6, wherein said metal frame is made of stainless steel.

8. The head support mechanism according to claim 6, wherein a longitudinal direction of said metal frame is different from a longitudinal direction of the flying lead.

9. The head support mechanism according to claim 6, wherein an angle between a longitudinal direction of said metal frame and a longitudinal direction of the flying lead is substantially 90°.

10. The head support mechanism according to claim 6, wherein metal frames are formed on both edge sides of said flying lead.

11. A magnetic disk device comprising:
    a head support mechanism including:
      a flexure supporting a head slider;
      a load beam supporting said flexure and giving a load to said bead slider; and
      a mount supporting said load beam;
      wherein a flying lead with plural flying lead members and a wiring pattern with plural wires connected to the flying lead members of the flying lead are provided at one end of the head support mechanism;
      wherein the plural flying lead members of the flying lead are spaced from each other by open spaces in a longitudinal direction of the head support mechanism;
      wherein the wiring pattern is covered with resin layer on both surface sides; and
      wherein one side of each of the resin layer is supported by a metal frame formed in the longitudinal direction of the head support mechanism, electrically insulated from said flying lead and said wiring pattern; and
    a carriage rotatably mounted on a pivot and provided with a coil at one end of the carriage and a carriage arm, at the other end, which is mounted with said head support mechanism by way of said mount;
    a magnetic circuit for applying a magnetic field to said coil; and
    a magnetic disk mounted on a rotary shaft.

12. A magnetic disk device according to claim 11, wherein said metal frame is made of stainless steel.

13. A magnetic disk device according to claim 11, wherein a longitudinal direction of said metal frame is different from a longitudinal direction of the flying lead.

14. A magnetic disk device according to claim 11, wherein an angle between a longitudinal direction of said metal frame and a longitudinal direction of the flying lead is substantially 90°.

15. A magnetic disk device according to claim 11, wherein metal frames are formed on both edge sides of said flying lead.

16. A magnetic disk device comprising:
    a head support mechanism including:
      a flexure supporting a head slider;
      a load beam supporting said flexure;
      a hinge supporting said load beam and giving a load to said head slider; and
      a mount supporting said hinge;
      wherein a flying lead with plural flying lead members and a wiring pattern with plural wires connected to the flying lead members of the flying lead are provided at one end of the head support mechanism;
      wherein the plural flying lead members of the flying lead are spaced from each other by open spaces in a longitudinal direction of the head support mechanism;
      wherein the wiring pattern is covered with resin layer on both surface sides; and
      wherein one side of each of the resin layer is supported by a metal frame formed in the longitudinal direction of the head support mechanism, electrically insulated from said flying lead and said wiring pattern; and
    a carriage rotatably mounted on a pivot and provided with a coil at one end of the carriage and a carriage arm, at the other end, which is mounted with said head support mechanism by way of said mount;
    a magnetic circuit for applying a magnetic field to said coil; and
    a magnetic disk mounted on a rotary shaft.

17. A magnetic disk device according to claim 16, wherein said metal frame is made of stainless steel.

18. A magnetic disk device according to claim 16, wherein a longitudinal direction of said metal frame is different from a longitudinal direction of the flying lead.

19. A magnetic disk device according to claim 16, wherein an angle between a longitudinal direction of said metal frame and a longitudinal direction of the flying lead is substantially 90°.

20. A magnetic disk device according to claim 16, wherein metal frames are formed on both edge sides of said flying lead.

* * * * *